(12) United States Patent
Kang et al.

(10) Patent No.: US 7,643,326 B2
(45) Date of Patent: Jan. 5, 2010

(54) SEMICONDUCTOR MEMORY DEVICE WITH FERROELECTRIC DEVICE

(75) Inventors: Hee Bok Kang, Cheongju-si (KR); Suk Kyoung Hong, Gwacheon-si (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 24 days.

(21) Appl. No.: 11/956,394

(22) Filed: Dec. 14, 2007

(65) Prior Publication Data
US 2009/0010037 A1    Jan. 8, 2009

(30) Foreign Application Priority Data
Jul. 4, 2007    (KR) ................. 10-2007-0067038

(51) Int. Cl.
*G11C 11/22* (2006.01)
(52) U.S. Cl. .................. 365/145; 365/65; 365/189.04
(58) Field of Classification Search .............. 365/65
See application file for complete search history.

(56) References Cited

U.S. PATENT DOCUMENTS

| | | | | |
|---|---|---|---|---|
| 5,412,596 A | * | 5/1995 | Hoshiba | ............. 365/145 |
| 5,717,638 A | * | 2/1998 | Kim | ............. 365/189.04 |
| 5,753,946 A | * | 5/1998 | Naiki et al. | ............. 257/295 |
| 6,044,034 A | | 3/2000 | Katakura | |
| 6,347,062 B2 | * | 2/2002 | Nii et al. | ............. 365/230.05 |
| 6,711,048 B2 | | 3/2004 | Chien | |
| 6,711,049 B1 | * | 3/2004 | Hsu et al. | ............. 365/145 |
| 6,724,645 B1 | | 4/2004 | Lanham et al. | |
| 7,126,839 B2 | * | 10/2006 | Kang | ............. 365/145 |
| 2003/0206430 A1 | | 11/2003 | Ho | |

FOREIGN PATENT DOCUMENTS

KR    10-2007-0065033    6/2007

* cited by examiner

*Primary Examiner*—Tan T. Nguyen
(74) *Attorney, Agent, or Firm*—IP&T Law Firm PLC

(57) ABSTRACT

A semiconductor memory device comprises a one-transistor (1-T) field effect transistor (FET) type ferroelectric device connected between a pair of bit lines and controlled by a word line, where a different channel resistance is induced to a channel region depending on a polarity state of a ferroelectric layer; a plurality of access transistors connected between the ferroelectric device and the pair of bit lines; and a plurality of port word lines configured to select the plurality of access transistors.

20 Claims, 9 Drawing Sheets

SEMICONDUCTOR MEMORY DEVICE WITH FERROELECTRIC DEVICE

This application is based upon and claims the benefit of priority to Korean Patent Application No. 10-2007-0067038, filed on Jul. 4, 2007, the entire contents of which are incorporated herein by reference.

TECHNICAL FIELD

The embodiments generally relate to a semiconductor memory device with a ferroelectric device, and more specifically, to a technology of embodying a multi-port DRAM cell with a one transistor-field effect transistor (TET) type having a nonvolatile characteristic.

BACKGROUND

Generally, electric power should be continuously supplied in order to store data as a volatile memory in a Dynamic Random Access Memory (DRAM). When electric power is instantly disconnected, data of a RAM may be destroyed because a memory cell of the DRAM is designed based on small charged electrons for keeping a charged electric power. If these charged electrons are not continuously recharged, the previously charged power can be destroyed.

A refresh operation refers to a recharging process of a semiconductor device of a memory chip. In every refresh cycle, memory cells of a row can be charged. Although the refresh operation is performed by memory control of the system, several chips are designed to perform a self-refresh operation.

For example, a DRAM has a self-refresh control circuit so as to perform a self-refresh operation without a Central Processing Unit (CPU) or an external refresh circuit. The self-refresh method to reduce power consumption has been used in a portable computer.

A conventional DRAM performs a refresh operation frequently because the DRAM is volatile and has a short refresh cycle. As a result, the frequent refresh operation increases power consumption and degrades operation performance.

Generally, a ferroelectric random access memory (FeRAM) has attracted considerable attention as next generation memory device because it has a data processing speed as fast as a DRAM and conserves data even after the power is turned off.

The FeRAM having structures similar to the DRAM includes capacitors made of a ferroelectric substance, so that it utilizes the characteristic of a high residual polarization of the ferroelectric substance in which data is not deleted even after an electric field is eliminated.

A one-transistor one-capacitor (1T1C) of the conventional FeRAM comprises a switching element configured to perform a switching operation depending on a state of a word line and to connect a bit line to a nonvolatile ferroelectric capacitor, and a nonvolatile ferroelectric capacitor connected between a plate line and one end of the switching element. The switching element is a NMOS transistor whose switching operation is controlled by a gate control signal.

SUMMARY

Disclosed is a multi-port DRAM cell using a 1T-FET type ferroelectric device to improve a data access speed.

Various embodiments are directed to facilitating an individual read/write operation of each port in a one-transistor FET type DRAM, to facilitating an individual refresh operation of each port in a one-transistor FET type DRAM, providing a multi port cell using a one-transistor FET type ferroelectric device by a simple process which does not include a capacitor process, and providing a multi-port cell using a one-transistor FET type ferroelectric device to reduce a cell area without a large-sized capacitor.

According to one embodiment, a semiconductor memory device comprises a one-transistor (1-T) field effect transistor (FET) type ferroelectric device connected between a pair of bit lines and controlled by a word line, where a different channel resistance is induced to a channel region depending on a polarity state of a ferroelectric layer; a plurality of access transistors connected between the ferroelectric device and the pair of bit lines, and a plurality of port word lines; configured to select the plurality of access transistors.

According to another embodiment, a semiconductor memory device comprises a plurality of multi port word lines arranged in a row direction, a plurality of paired multi port bit lines arranged in a column direction, and a plurality of unit cells formed in a region where the multi port word line is crossed with the multi port bit line. The unit cells may comprise a one-transistor (1-T) field effect transistor (FET) type ferroelectric device connected between a pair of bit lines and controlled by a word line, where a different channel resistance is induced to a channel region depending on a polarity state of a ferroelectric layer; a plurality of access transistors connected between the ferroelectric device and the pair of bit lines; and a plurality of port word lines configured to select the plurality of access transistors.

According to yet another embodiment, a semiconductor memory device with a ferroelectric device comprises a one-transistor (1-T) field effect transistor (FET) type ferroelectric device controlled by a word line, where a different channel resistance is induced to a channel region depending on a polarity state of a ferroelectric layer; a first access transistor connected between a first bit line and the ferroelectric device and controlled by a first port word line; a second access transistor connected between a second bit line and the ferroelectric device and controlled by a second port word line; a third access transistor connected between a third bit line and the ferroelectric device, and controlled by the first port word line; and a fourth access transistor connected between a fourth bit line and the ferroelectric device, and controlled by the second port word line.

DETAILED DESCRIPTION

Figure 1:
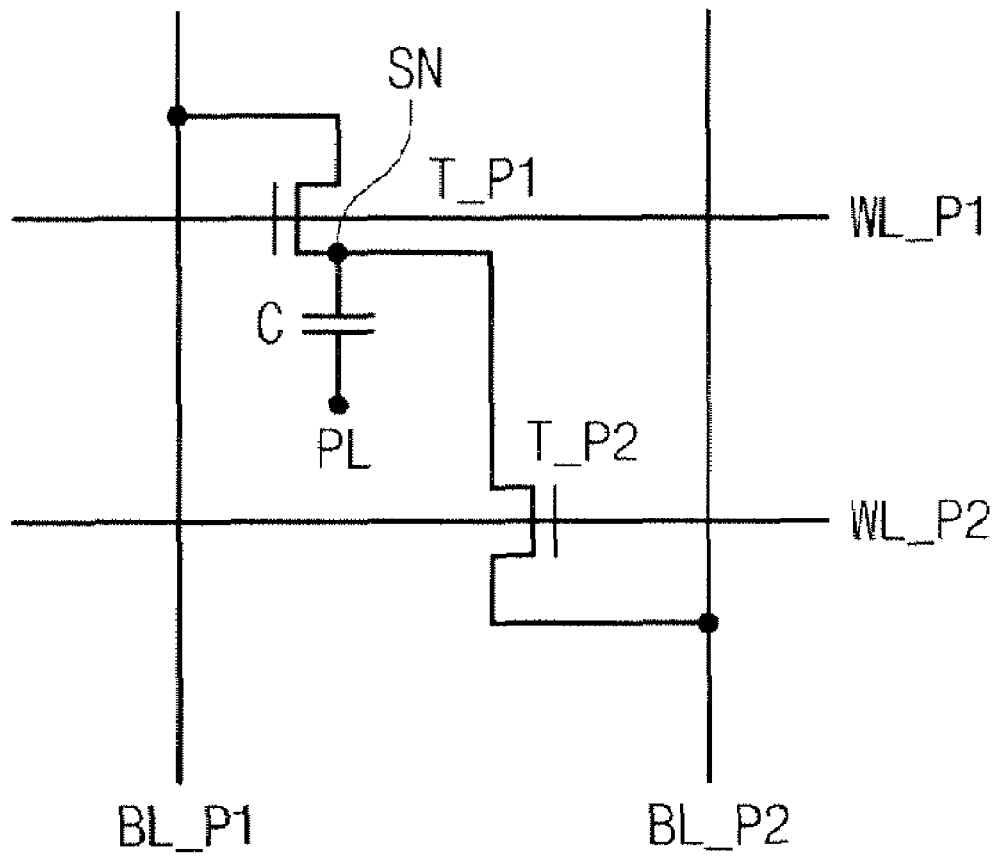
FIG. 1 is a circuit diagram illustrating a conventional 2T1C DRAM cell consistent with the invention.

FIG. 1 is a circuit diagram illustrating a conventional 2T1C DRAM as a dual port.

A conventional DRAM cell includes two access transistors T_P1, T_P2 controlled by two word lines WL_P1, WL_P2, and a capacitor C. The access transistors T-P1, T_P2 are MOS transistors.

Each drain terminal of the access transistors T_P1, T_P2 is connected to two bit lines BL_P1, BL_P2. Each source terminal of the access transistors T_P1, T_P2 is connected to one electrode of the capacitor C, that is, a storage node SN. In the storage node SN, written charges are stored.

The other electrode of the capacitor C is connected to a common cell plate line PL to receive a cell plate voltage VCP. The cell plate voltage VCP is defined by a half power voltage VDD. The power voltage VDD is defined by a high operation voltage of the cell.

The word line WL_P1 is connected to a first port, and the word line WL_P2 is connected to a second port. The bit line BL_P1 is connected to the first port, and the bit line BL_P2 is connected to the second port.

The improvement of system performance requires development of access performance of the memory cell. However, a conventional memory cell including only one port cannot perform a plurality of read/write operations.

The conventional 2T1C DRAM cell includes a multi port to perform a plurality of operations. The multi port cell stores data by a charge sharing method with a capacitor node, so that there is a limit in an operation speed of data access. In order to obtain a capacitor, a capacitor process is performed so that the process becomes complicated. Also, a large-sized capacitor enlarges the whole cell size.

Figure 2:
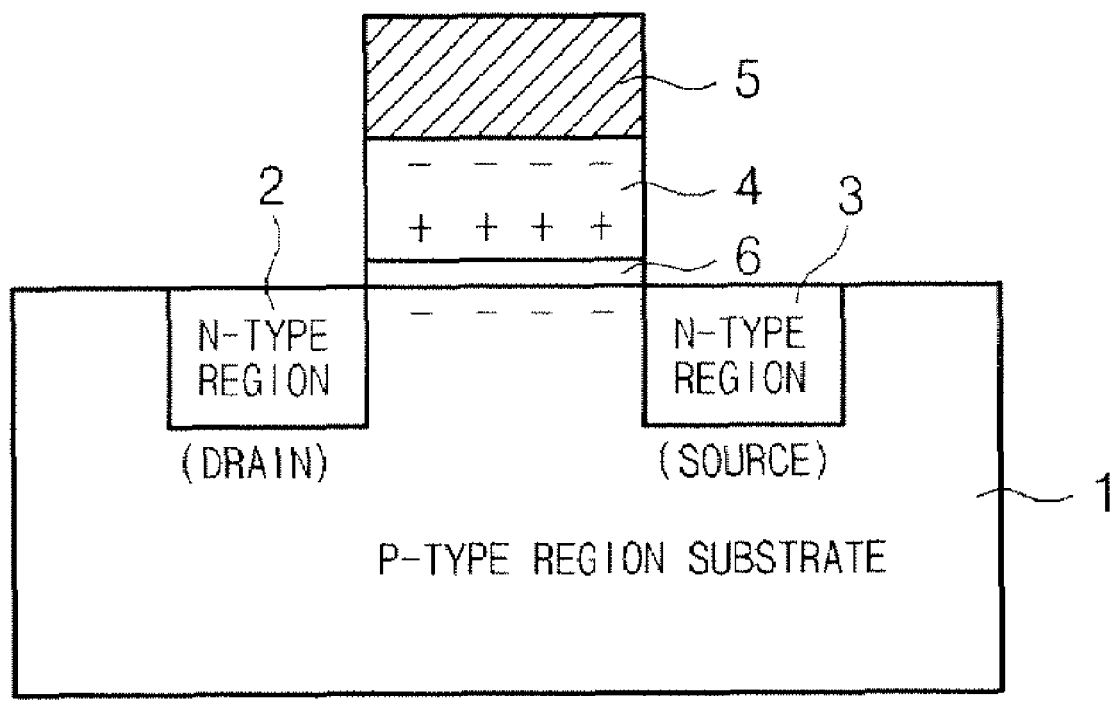
FIG. 2 is a cross-sectional diagram illustrating a semiconductor memory device consistent with the invention.

FIG. 2 is a cross-sectional diagram illustrating a semiconductor memory device consistent with the invention. A One-Transistor (1-T) Field Effect Transistor (FET) type ferroelectric memory cell comprises a P-type channel region, a N-type drain region 2, and a N-type source region 3 which are formed in a P-type region substrate 1. A ferroelectric layer 4 is formed over the channel region, and a word line 5 is formed over the ferroelectric layer 4.

A buffer insulating layer 6 is formed between the channel region and the ferroelectric layer 4 for stabilization of the process. That is, the buffer insulating layer 6 is formed to eliminate process and material differences between the channel region and the ferroelectric layer 4.

The semiconductor memory device reads and write data in response to a channel resistance of the memory cell which is differentiated depending on a polarization state of the ferroelectric layer 4.

When a polarity of the ferroelectric layer 4 induces a positive charge to a channel, the memory cell becomes at a high resistance channel state to be off. On the other hand, when the polarity of the ferroelectric layer 4 induces a negative charge to the channel, the memory cell becomes at a low resistance state to be on. The ferroelectric memory cell selects polarity kinds of the ferroelectric layer 4 to write data in the cell so that the memory cell becomes nonvolatile.

Figure 3A:
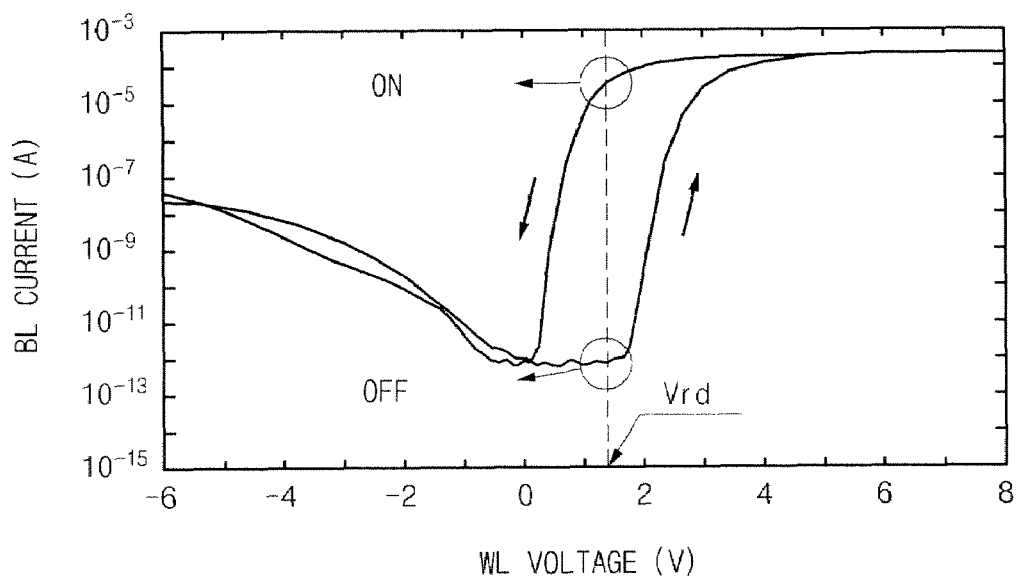
FIGS. 3a and 3b are graphs illustrating a bit line current in a read mode of a semiconductor memory device consistent with the invention.
Figure 3B:
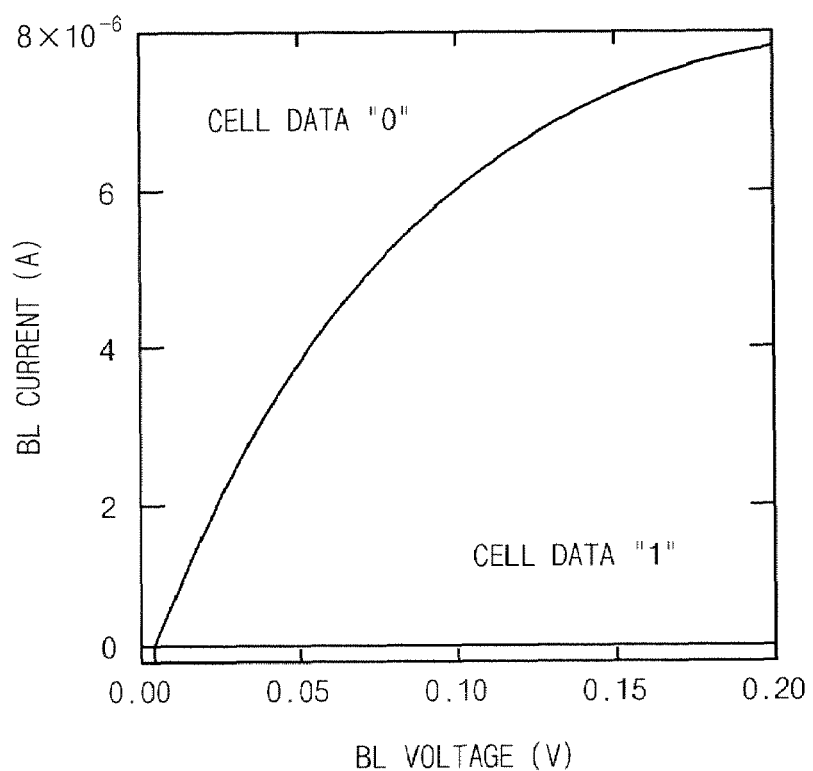

FIGS. 3a and 3b are graphs illustrating a bit line current in a read mode of a semiconductor memory device consistent with the invention. As shown in FIG. 3a, a voltage value when the P-type channel region is on/off is set to be a word line read voltage Vrd. Based on the same word line read voltage Vrd, the largest amount of bit line BL current flows when the channel region is turned on, and the smallest amount of bit line BL current flows when the channel region is turned off.

As shown in FIG. 3b, when a voltage of the bit line BL is changed while the same word line read voltage Vrd is applied, the word line read voltage Vrd has a different current value of the bit line BL depending on values of cell data stored in the memory cell. That is, when data "0" is stored in the memory cell, a large amount of bit line BL current flows in increase of the bit line BL voltage. When data "1" is stored in the memory cell, the bit line BL current is not changed and flows with a small amount in spite of increase of the bit line BL voltage.

Figure 4:
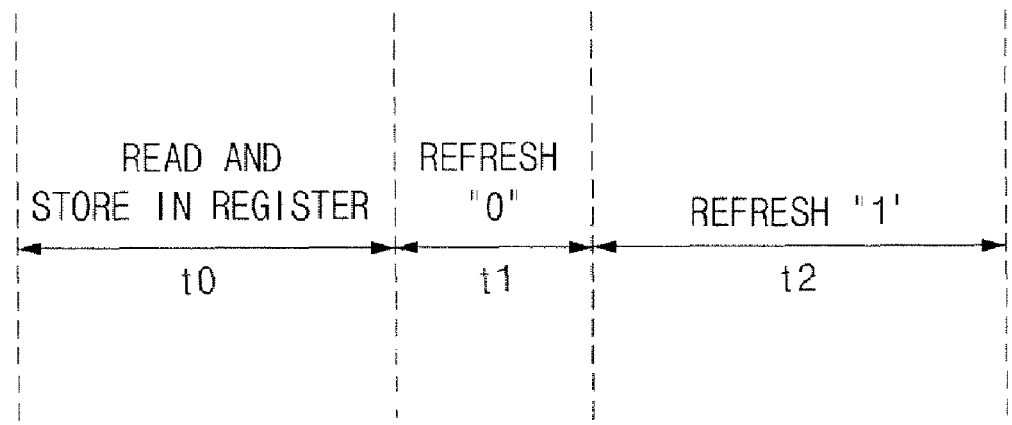
FIG. 4 is a diagram illustrating a refresh cycle timing of a semiconductor memory device consistent with the invention.

FIG. 4 is a diagram illustrating a refresh cycle timing of a semiconductor memory device consistent with the invention. In a period t0, cell data are read and amplified in all cells of the selected row address, and stored in a register. In a period t1, a refresh "0" operation is performed to restore the data "0" in the corresponding cells of the selected row address. In a period t2, a refresh "1" operation is performed to restore the data "1" in the corresponding cell of the selected row address.

Figure 5:
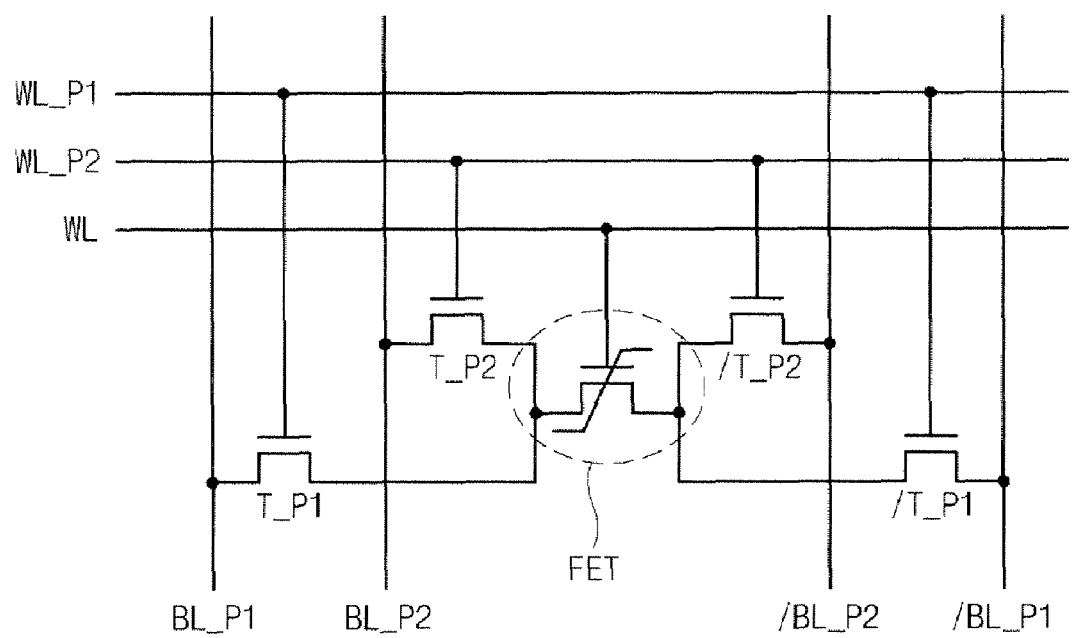
FIG. 5 is a circuit diagram illustrating a semiconductor memory device as a dual port consistent with the invention.

FIG. 5 is a circuit diagram illustrating a semiconductor memory device as a dual port consistent with the invention. The semiconductor memory device comprises a pair of access transistors T_P1, /T_P1 regulated by a word line WL_P1, a pair of access transistors T_P2, /T_P2 regulated by a word line WL_P2, and a one transistor-field effect transistor (1T-FET) type ferroelectric device. Each of the access transistors T_P1, /T_P1, T_P2, /T_P2 as a selective switching element for selecting a port has a MOS transistor structure.

Drain terminals of the access transistors T_P1, T_P2 are connected to bit lines BL_P1, BL_P2. Source terminals of the access transistors T_P1, T_P2 are connected to one electrode of the 1T-FET ferroelectric device.

The drain terminals of the access transistors T_P1, T_P2 are connected to bit lines /BL_P1, /BL_P2. Source terminals of the access transistors T_P1, T_P2 are connected to one electrode of the 1T-FET ferroelectric device. The 1T-FET type ferroelectric device FET connected between the access transistors T_P1, /T_P1 has a gate connected to a word line WL.

A word line WL_P1 is connected to a first port, and a word line WL_P2 is connected to a second port. The first port is connected to a pair of bit lines BL_P1, /BL_P1, and the second port is connected to a pair of bit lines BL_P2, /BL_P2.

Figure 6:
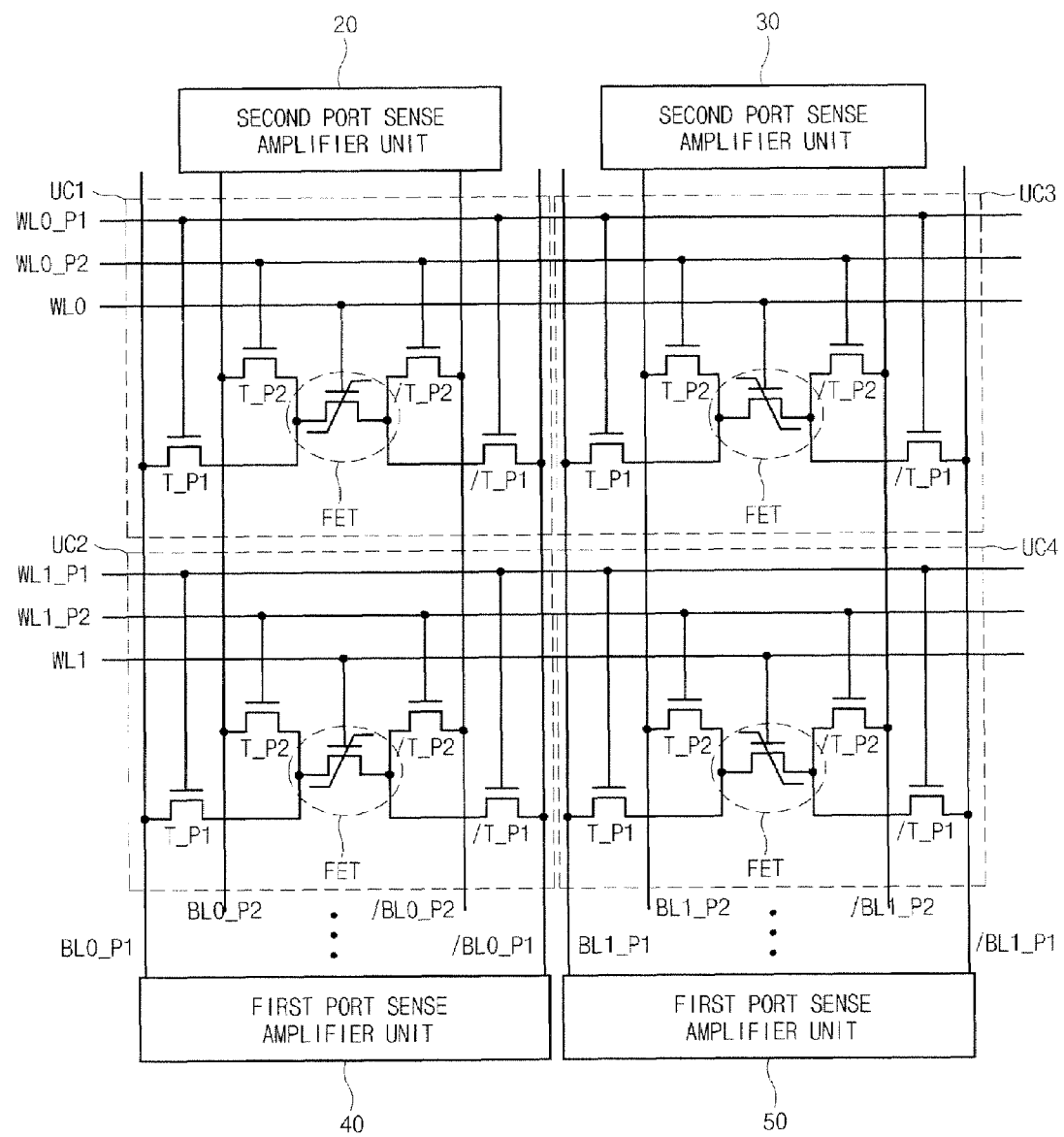
FIG. 6 is a circuit diagram illustrating a one-transistor type DRAM as a dual port cell array consistent with the invention.

FIG. 6 is a circuit diagram illustrating a one-transistor type DRAM as a dual port cell array consistent with the invention. The cell array includes a plurality of unit cells UC arranged in row and column directions. The unit cell UC includes two pairs of access transistors T_P1, /T_P1, T_P2, /T_P2, and one 1T-FET type ferroelectric element FET.

That is, a plurality of multi port word lines WL0_P1, WL0_P2, WL1_P1, WL1_P2 are arranged in the row direction, and a plurality of multi port bit lines BL0_P1, /BL0_P1, BL0_P2, /BL0_P2, BL1_P1, /BL1_P1, BL1_P2, /BL1_P2. A plurality of unit cells UC1~UC4 are located in a region where the multi port word lines WL0_P1, WL0_P2, WL1_P1, WL1_P2 are crossed with the multi port bit lines BL0_P1, /BL0_P1, BL0_P2, /BL0_P2, BL1_P1, /BL1_P1, BL1_P2, /BL1_P2.

The unit cells UC1, UC2 are connected between the bit lines BL0_P1, /BL0_P1 corresponding to the first port and the bit lines BL0_P2, /BL0_P2 corresponding to the second port. The unit cells UC1, UC2 arranged in top and bottom portions share bit lines in the same port.

The unit cells UC3, UC4 are connected between the bit lines BL1_P1, /BL1_P1 corresponding to the first port and the bit lines BL1_P2, /BL1_P2 corresponding to the second port.

The unit cells UC3, UC4 arranged in top and bottom portions share bit lines in the same port.

The bit lines BL0_P1, /BL0_P1 of the first port connected to the paired access transistors T_P1, /T_P1 of the unit cells UC1, UC2 are connected to a first port sense amplifier unit 40. The bit lines BL0_P2, /BL0_P2 of the second port connected to the paired access transistors T_P2, /T_P2 of the unit cells UC1, UC2 are connected to a second port sense amplifier unit 20.

The bit lines BL1_P1, /BL1_P1 of the first port connected to the paired access transistors T_P1, /T_P1 of the unit cells UC3, UC4 are connected to a first port sense amplifier unit 50. The bit lines BL1_P2, /BL1_P2 of the second port connected to the paired access transistors T_P2, /T_P2 of the unit cells UC3, UC4 are connected to a second port sense amplifier unit 30.

Figure 7:
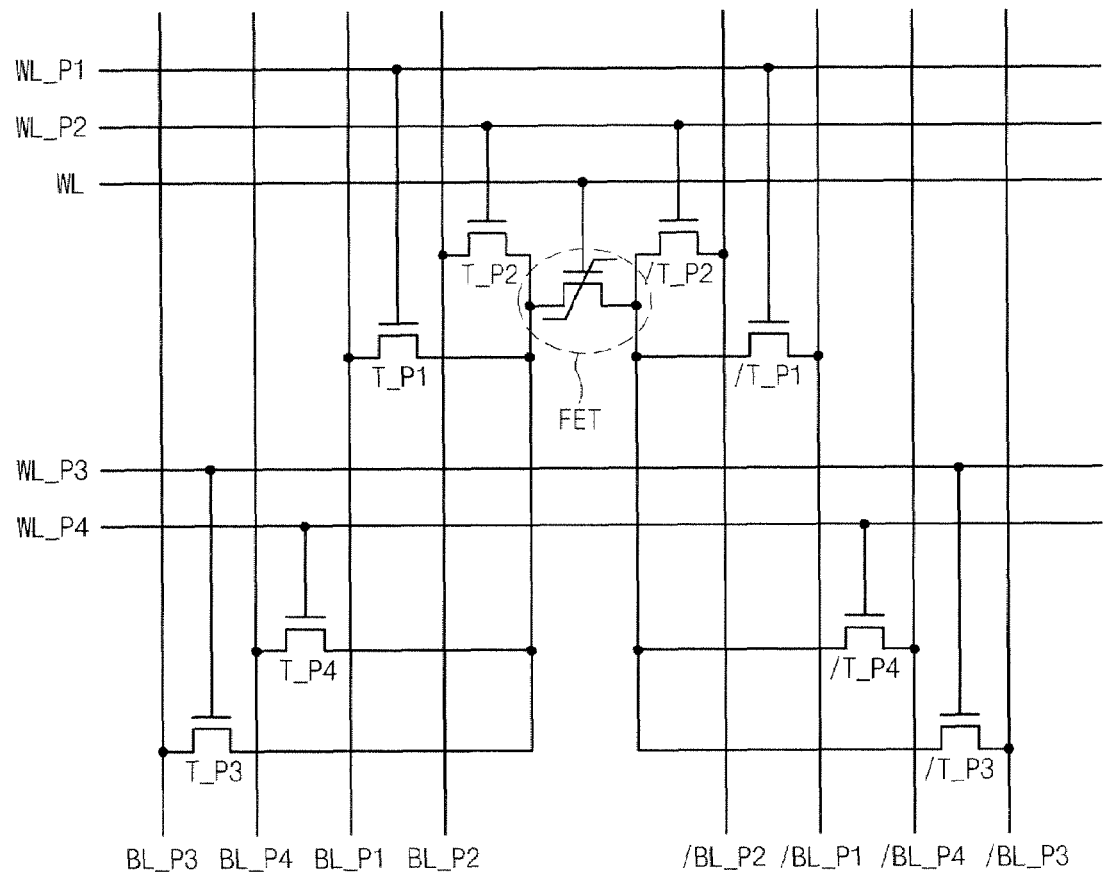
FIG. 7 is a circuit diagram illustrating a one-transistor type DRAM as two or more multi ports consistent with the invention.

FIG. 7 is a circuit diagram illustrating a one-transistor type DRAM as two or more multi ports consistent with the invention.

The semiconductor memory device includes a plurality of paired access transistors T_P1~T_P4, /T_P1~/T_P4 controlled by a plurality of WL_P1~WL_P4 and a 1T_FET ferroelectric device FET. Each of the paired access transistors T_P1~T_P4, /T_P1~/T_P4 as a selective switching element for selecting a corresponding port has a MOS transistor structure.

Drain terminals of the paired access transistors T_P1~T_P4, /T_P1~/T_P4 are connected to the corresponding to the paired bit lines BL_P1~BL_P4, /BL_P1~/BL_P4. Source terminals of the access transistors T_P1~T_P4 are connected to one electrode of the 1T-FET type ferroelectric device FET. Other source terminals of the access transistors /T_P1~/T_P4 are connected to the other electrode of the 1T_FET type ferroelectric device FET.

The 1T-FET type ferroelectric device connected between the paired access transistors T_P1~T_P4, /T_P1~/T_P4 has a gate connected to a word line WL.

The word line WL_P1 is connected to a first port, and the word line WL_P2 is connected to a second port. The word line WL_P3 is connected to a third port, and the word line WL_P4 is connected to a fourth port.

The paired bit lines BL_P1, /BL_P1 are connected to the first port, and the paired bit lines BL_P2/BL_P2 are connected to a second port. The paired bit lines BL_P3, /BL_P3 are connected to the third port, and the paired bit lines BL_P4, /BL_P4 are connected to a fourth port.

The multi port DRAM cell includes the word lines WL and the paired bit lines BL, /BL corresponding to a plurality of ports, and has a 1T-FET type ferroelectric device FET. In an embodiment of the invention, the access transistor T_P is selected by a plurality of word lines WL_P to perform individual read/write operations and refresh operation in each port.

When the word line WL0_P1 corresponding to the first port is activated, the paired access transistors T_P1, /T_P1 are selected. As a result, data stored in the 1T-FET type ferroelectric device FET can be read by the paired access transistors T_P1, /T_P1.

When the word line WL0_P2 corresponding to the second port is activated, the paired access transistors T_P2, /T_P2 are selected. As a result, data can be stored in the 1T-FET type ferroelectric device FET by the paired access transistors T_P2, /T_P2.

Although the multi port cell has four ports in the embodiment of the invention, the multi port cell can be four or more ports. In this case, the multi port cell can include access transistors corresponding to the number of ports.

Figure 8:
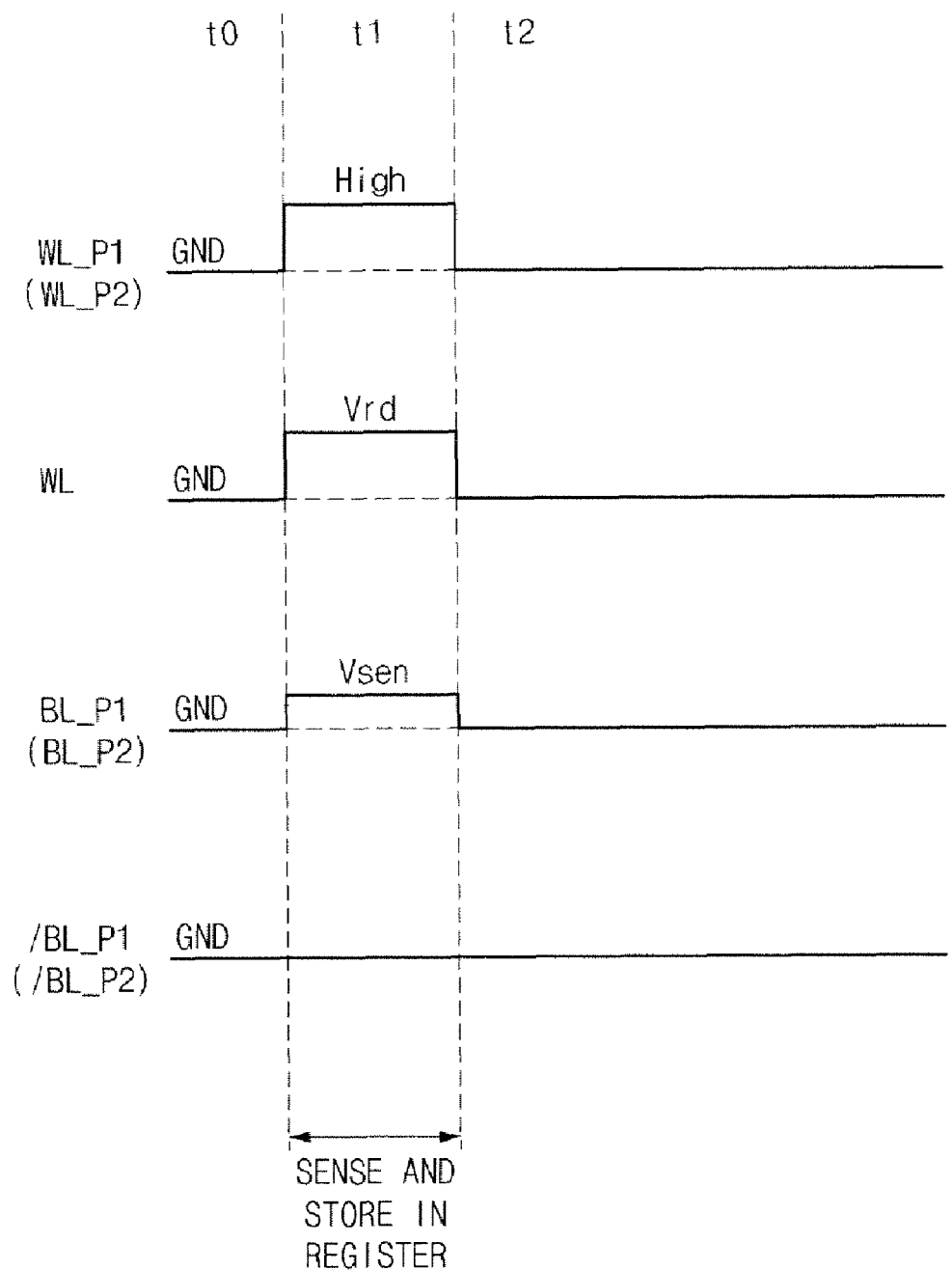
FIG. 8 is a timing diagram illustrating a read operation of a semiconductor memory device consistent with the invention.

FIG. 8 is a timing diagram illustrating a read operation of a semiconductor memory device consistent with the invention. FIG. 8 shows when the port word line WL_P1 and the port bit line BL_P1 are selected.

In a period t0, the port word line WL_P1, the word line WL and the paired bit lines BL_P1, /BL_P1 maintain a ground voltage GND level.

In a period t1, the port word line WL_P1 transits from the ground voltage GND level to a high voltage level, and the word line WL transits from the ground voltage GND level to a read voltage Vrd level.

Bit line BL_P1 of the paired port bit lines BL_P1, /BL_P1 transit from the ground voltage GND level to a sensing bias voltage Vsen level. Bit line /BL_P1 of the paired port bit lines BL_P1, /BL_P1 maintain the ground voltage GND level.

The access transistor T_P1 is turned on to sense and amplify a value of a cell sensing current Isen flowing through the bit line BL_P1 in a first port sense amplifier unit S/A, thereby storing the value in a register REG.

In a period t2, the port word line WL_P1 transits from the high voltage level to the ground voltage GND level, and the word line WL transits from the read voltage Vrd to the ground voltage GND level. The bit line BL_P1 transits from the sensing bias voltage Vsen to the ground voltage GND level.

Figure 9:
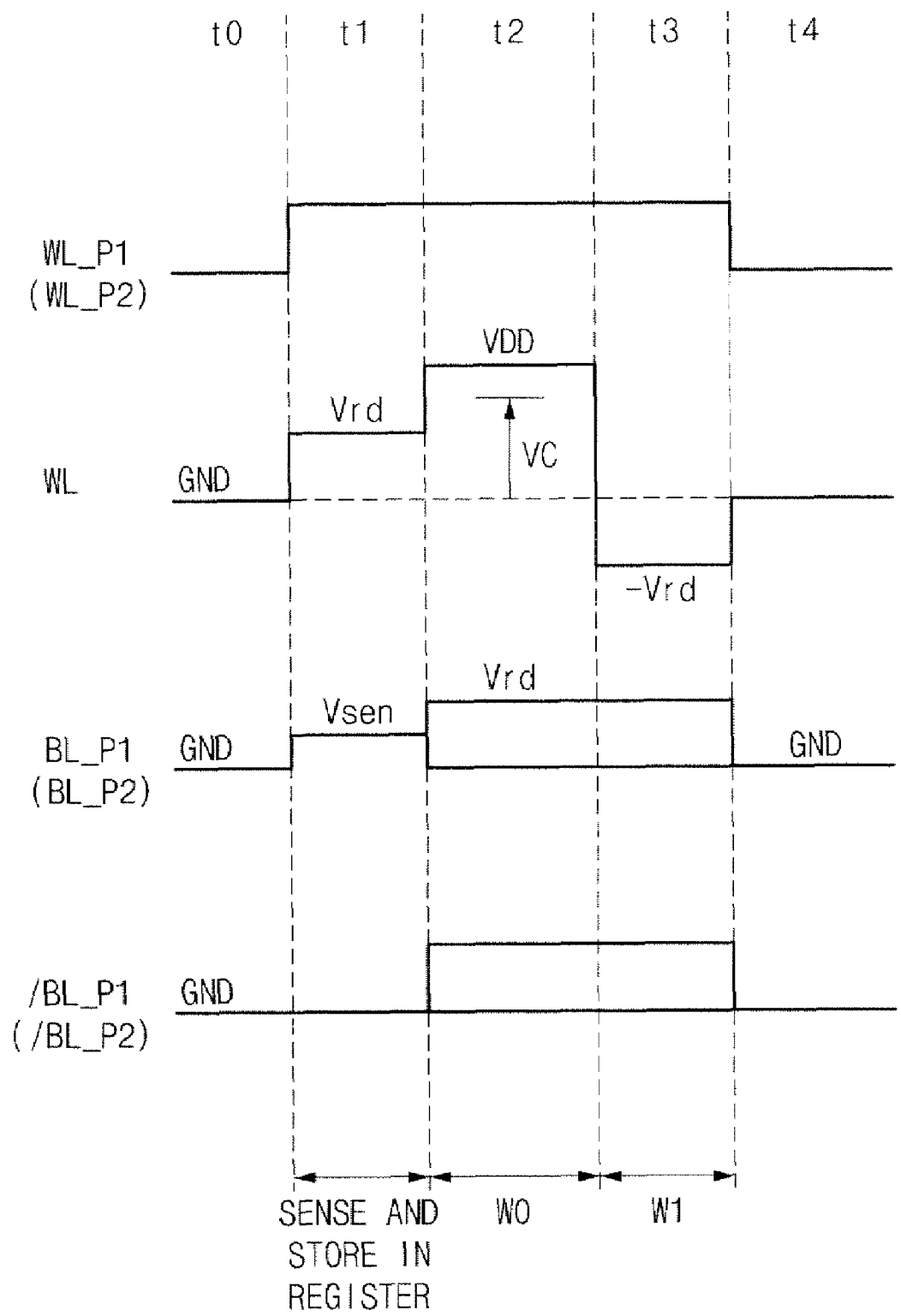
FIG. 9 is a timing diagram illustrating a write operation of a semiconductor memory device consistent with the invention.

FIG. 9 is a timing diagram illustrating a write operation of a semiconductor memory device consistent with the invention.

In a period t0, the port word line WL_P1, the word line WL and the paired bit lines BL_P1, /BL_P1 maintain a ground voltage GND level.

In a period t1, the port word line WL_P1 transits from the ground voltage GND level to a high voltage level, and the word line WL transits from the ground voltage GND level to a read voltage Vrd level.

The bit line BL_P1 of the paired port bit lines BL_P1, /BL_P1 transits from the ground voltage GND level to a sensing bias voltage Vsen level. The bit line /BL_P1 of the paired port bit lines BL_P1, /BL_P1 maintains the ground voltage GND level.

In a period t2, the port word line WL_P1 maintains the high voltage level. The word line WL transits from the read voltage Vrd level to a power voltage VDD level. The read voltage Vrd is smaller than a threshold voltage Vc, and the power voltage VDD is larger than the threshold voltage Vc. The sensing bias voltage Vsen is smaller than the read voltage Vrd.

The bit line BL_P1 transits from the sensing bias voltage Vsen level to the read voltage Vrd or the ground voltage GND level. The bit line /BL_P1 maintains the ground voltage GND level or transits to the read voltage Vrd level. As a result, the data "0" can be written in all cells in the selected row address.

In a period t3, the port word line WL_P1 maintains the high voltage level. The word line WL transits from the power voltage VDD level to a negative read voltage −Vrd level.

The bit line BL_P1 of the paired port bit lines BL_P1, /BL_P1 maintains the read voltage Vrd or the ground voltage GND level. The bit line /BL_P1 maintains the ground voltage GND level or transits to the read voltage Vrd level. The data stored in the register REG is written in the memory cell to restore data, or new externally applied data can be written.

The data "0" is written in the period t1, and the data "0" is maintained in the period t3. The data "1" is written.

In a period t4, the port word line WL_P1 transits from the high voltage level to the ground voltage GND level. The word line WL transits from the negative read voltage −Vrd level to the ground voltage GND level. The bit line BL_P1 transits from the read voltage Vrd level to the ground voltage GND level.

The positive read voltage Vrd, the power voltage VDD, the negative read voltage −Vrd and other voltages supplied from the port word line WL_P are supplied from a row decoder. The row decoder is disclosed in Korean Patent Application No. 2007-0065033 filed by the same inventor.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor memory device comprising:
   a one-transistor (1-T) field effect transistor (FET) type ferroelectric device connected between a plurality of pairs of bit lines, where a different channel resistance is induced to a channel region depending on a polarity state of a ferroelectric layer;
   a plurality of access transistors connected between the ferroelectric device and the plurality of pairs of bit lines;
   a plurality of port word lines configured to select the access transistors; and
   a word line coupled to a gate of the ferroelectric device to control the ferroelectric device.

2. The device according to claim 1, wherein the plurality of access transistors are formed to have the same number of bit lines.

3. The device according to claim 1, wherein the plurality of access transistors are paired and connected to the plurality of port word lines individually.

4. The device according to claim 1, wherein the plurality of access transistors are paired and each paired of access transistors is connected to a different pair of the bit lines.

5. The device according to claim 1, wherein the plurality of access transistors are individually operated by the plurality of port word lines.

6. The device according to claim 1, wherein the plurality of access transistors comprises:
   first and second access transistor pairs connected between a pair of first bit lines and both ends of the ferroelectric device, and controlled by a first port word line; and
   third and fourth access transistor pairs connected between a pair of second bit lines and both ends of the ferroelectric device, and controlled by a second port word line.

7. A semiconductor memory device comprising:
   a plurality of multi port word lines arranged in a row direction;
   a plurality of paired multi port bit lines arranged in a column direction; and
   a plurality of unit cells formed in a region where one of the multi port word lines is crossed with one of the multi port bit lines, wherein the unit cells comprise:
      a one-transistor (1-T) field effect transistor (FET) type ferroelectric device connected between a pair of bit lines, the ferroelectric device comprising a channel region on a ferroelectric layer, the ferroelectric device having a different channel resistance induced to the channel region depending on a polarity state of the ferroelectric layer;
      a plurality of access transistors connected between the ferroelectric device and the pair of bit lines; and
      a word line coupled to a gate of the ferroelectric device to control the ferroelectric device.

8. The device according to claim 7, further comprising a sense amplifier configured to sense and amplify data received from the multi port bit line.

9. The device according to claim 8, wherein one sense amplifier unit is shared by bit lines connected to the same port from the multi port bit lines.

10. The device according to claim 7, wherein the plurality of access transistors are paired and connected to the ferroelectric device.

11. The device according to claim 7, wherein the multi port bit lines are connected to the same number of the access transistors.

12. The device according to claim 7, wherein the plurality of access transistors are paired and the pairs of access transistors are connected to different multi-port bit lines, individually.

13. The device according to claim 7, wherein the plurality of access transistors are operated by the multi-port word lines individually.

14. The device according to claim 7, wherein the plurality of the access transistors comprises:
   first and second access transistor pairs connected between a pair of first multi port bit lines and both ends of the ferroelectric device, and controlled by a first multi-port word line; and
   third and fourth access transistor pairs connected between a pair of second multi-port bit lines and both ends of the ferroelectric device, and controlled by a second multi port word line.

15. A semiconductor memory device with a ferroelectric device, the semiconductor memory device comprising:
   a one-transistor (1-T) field effect transistor (FET) type ferroelectric device comprising a channel region on a ferroelectric layer, the ferroelectric device having a different channel resistance induced to the channel region depending on a polarity state of the ferroelectric layer;
   a first access transistor connected between a first bit line and the ferroelectric device, and controlled by a first port word line;
   a second access transistor connected between a second bit line and the ferroelectric device, and controlled by a second port word line;
   a third access transistor connected between a third bit line and the ferroelectric device, and controlled by the first port word line;
   a fourth access transistor connected between a fourth bit line and the ferroelectric device, and controlled by the second port word line; and
   a word line coupled to a gate of the ferroelectric device to control the ferroelectric device.

16. The device according to claim 15, wherein read and write operations are performed depending on a voltage level of the word line.

17. The device according to claim 15, further comprising a sense amplifier unit configured to sense and amplify data received from the first through fourth bit lines.

18. The device according to claim 17, wherein the sense amplifier is shared by bit lines connected to the same port from the first through fourth bit lines.

19. The device according to claim 15, wherein a pair selected from the first through fourth transistors is connected to the ferroelectric device in each port.

20. The device according to claim 15, further comprising:
a fifth access transistor connected between a fifth bit line and the ferroelectric device and controlled by a third port word line;
a sixth access transistor connected between a sixth bit line and the ferroelectric device and controlled by a fourth port word line;
a seventh access transistor connected between a seventh bit line and the ferroelectric device and controlled by the third port word line; and
an eighth access transistor connected between an eighth bit line and the ferroelectric device and controlled by the fourth port word line.

\* \* \* \* \*